United States Patent
Horie

(10) Patent No.: US 7,317,254 B2
(45) Date of Patent: Jan. 8, 2008

(54) SEMICONDUCTOR DEVICE MOUNTING STRUCTURE FOR REDUCING THERMAL STRESS AND WARPAGE

(75) Inventor: Masanao Horie, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 181 days.

(21) Appl. No.: 11/217,292

(22) Filed: Sep. 2, 2005

(65) Prior Publication Data

US 2006/0049520 A1    Mar. 9, 2006

(30) Foreign Application Priority Data

Sep. 3, 2004    (JP)    ............................. 2004-256519

(51) Int. Cl.
  *H01L 23/48*  (2006.01)
  *H01L 23/52*  (2006.01)
  *H01L 29/40*  (2006.01)

(52) U.S. Cl. .................. 257/773; 257/737; 257/775; 257/776; 257/778; 257/E21.53; 257/E23.069

(58) Field of Classification Search ................ 257/737, 257/738, 777, 778, E23.021, E23.069, E21.508, 257/772–776, 693, 779, E21.53; 438/613–617; 228/180.22

See application file for complete search history.

(56) References Cited

U.S. PATENT DOCUMENTS

| 6,025,648 | A  | * | 2/2000 | Takahashi et al. | ........... 257/778 |
| 6,657,311 | B1 | * | 12/2003 | Hortaleza et al. | ............ 257/778 |
| 6,731,012 | B1 | * | 5/2004 | Brodsky et al. | ............. 257/778 |
| 2003/0052417 | A1 | * | 3/2003 | Hosaka | ........................ 257/786 |

FOREIGN PATENT DOCUMENTS

| JP | 11-345823 | 12/1999 |
| JP | 2000-260811 | 9/2000 |
| JP | 2004-63515 | 2/2004 |

* cited by examiner

*Primary Examiner*—Jasmine Clark
(74) *Attorney, Agent, or Firm*—McGinn IP Law Group, PLLC

(57) ABSTRACT

A semiconductor device is composed of a circuit board, a semiconductor chip connected with the circuit board by a plurality of bumps. The semiconductor chip includes a center portion and a peripheral portion surrounding the center portion. The peripheral portion has a thickness smaller than that of the center portion.

20 Claims, 15 Drawing Sheets

Fig. 11

| | THERMAL STRESS ON C ($10^{-1}$GPa) | THERMAL STRESS ON B ($10^{-1}$GPa) | WARPAGE AT A' ($\mu$m) |
|---|---|---|---|
| COMPARATIVE EXAMPLE 1 | 0.384 | 0.123 | -18.7 |
| COMPARATIVE EXAMPLE 2 | 0.386 | 0.0831 | -25.3 |
| COMPARATIVE EXAMPLE 3 | 0.427 | 0.0231 | -31.4 |
| EMBODIMENT 1 | 0.384 | 0.0206 | -20.0 |

SEMICONDUCTOR DEVICE MOUNTING STRUCTURE FOR REDUCING THERMAL STRESS AND WARPAGE

BACKGROUND OF THE INVENTION

1. Field of the Invention

The present invention relates to semiconductor devices and methods for manufacturing the same. More particularly, the present invention relates to flip-chip (or bare chip) packaging techniques for improving mounting reliability.

2. Description of the Related Art

Recent demands on semiconductor devices include high-speed operation and high integration density, and thus the structure and manufacture process of large scale integrated circuits (LSI) are designed to satisfy such demands. For example, high-end LSIs often adopt the flip-chip or bare chip packaging.

One issue of the conventional flip-chip packaging is that thermal stress is caused on solder bumps used for flip-chip connection between an LSI chip and a circuit board.

One approach for reducing the thermal stress is to provide grooves on the rear surface of the LSI chip as disclosed in Japanese Laid Open Patent Application No. P2000-260811. FIG. 1A is a plan view illustrating the plane structure of such-designed semiconductor device, and FIG. 1B is a section view illustrating the cross sectional structure at the section I-I' shown in FIG. 1A.

An LSI chip 51 and a circuit board 52 are mechanically and electrically connected via solder bumps 53. The space between the LSI chip 51 and the circuit board 52 is filled with protective resin 54 to cover the solder bumps 53. The LSI chip 51 is provided with grooves 58 on the rear surface, which are exemplarily disposed to form a lattice.

The manufacture process of the semiconductor device shown in FIG. 1A begins with attaching the solder bumps 53 on the LSI chip 51 through printing or ball mounting, which is a conventional process also used for manufacturing flip-chip ball grid array (FCBGA) devices and bare-chip devices. This is followed by reflowing. The LSI chip 51 attached with the solder bumps 53 is then mounted on the circuit board 52 through reflowing with the LSI chip 51 positioned at a desired position. The space between the LSI chip 51 and the circuit board 52 is then filled with the resin 54 to completely cover the solder bumps 53. This is followed by a baking process. The grooves 58 are then formed on the rear surface of the LSI chip 51 by using a laser or a cutter. This completes the semiconductor device shown in FIG. 1A.

Another approach for reducing the thermal stress is to reduce the thickness of the LSI chip. FIG. 2A is a plane view illustrating the plane structure of such-designed semiconductor device, and FIG. 2B is a section view illustrating the cross sectional structure at the section II-II' shown in FIG. 2A. An LSI chip 101 and a circuit board 102 are mechanically and electrically connected via solder bumps 103. The space between the LSI chip 101 and the circuit board 102 is filled with protective resin 104 to cover the solder bumps 103. The thickness of the LSI chip 101 is reduced down to about 300 µm; it should be noted that an LSI chip typically has a thickness of about 725 µm.

The reduction in the thickness of the LSI chip is typically achieved by rear-surface grinding. Japanese Open Laid Patent Application No. 2004-63515 discloses that a semiconductor chip is grinded on the rear surface after the semiconductor chip is mounted on a circuit board.

Japanese Open Laid Patent Application No. H11-345823 discloses another approach for reducing the thermal stress caused on the solder bumps, in which a semiconductor chip having a reduced thickness is mounted on a circuit board so that the semiconductor chip is curved in an opposite direction from the circuit board.

However, there is still room for improvement in semiconductor device structure as described in the following. Firstly, conventional techniques often exhibit insufficient thermal stress reduction. Secondly, conventional techniques often suffer from increased warpage of the LSI chip; the reduction in the thickness of the LSI chip undesirably increases the warpage of the LSI chip.

Therefore, there is a need for providing a technique for reducing both of the thermal stress caused on the bumps and the warpage of the LSI chip.

SUMMARY OF THE INVENTION

In an aspect of the present invention, a semiconductor device is composed of a circuit board, a semiconductor chip connected with the circuit board by a plurality of bumps. The semiconductor chip includes a center portion and a peripheral portion surrounding the center portion. The peripheral portion has a thickness smaller than that of the center portion.

In the device thus constructed, the peripheral portion having a relatively-reduced thickness effectively absorbs the thermal stress caused on the bumps, while the center portion having a relatively-increased thickness provides mechanical stiffness to reduce the warpage of the semiconductor chip. This effectively improves the mount reliability of the semiconductor device.

BRIEF DESCRIPTION OF THE DRAWINGS

The above and other advantages and features of the present invention will be more apparent from the following description taken in conjunction with the accompanied drawings, in which:

FIGS. 10B-1 and 10B-2 illustrate the semiconductor device structure model used for stress simulation of Comparative Example 1;

FIGS. 10C-1 and 10C-2 illustrate the semiconductor device structure model used for stress simulation of Comparative Example 2;

FIGS. 10D-1 and 10D-2 illustrate the semiconductor device structure model used for stress simulation of Comparative Example 3; and FIG. 11 is a table describing thermal stresses and warpages obtained by the stress simulations implemented for Comparative Examples 1 to 3 and Embodiment 1.

DESCRIPTION OF THE PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed. It should be noted that same or similar numerals denoted like or corresponding elements in the attached drawings.

First Embodiment

Figure 3A:
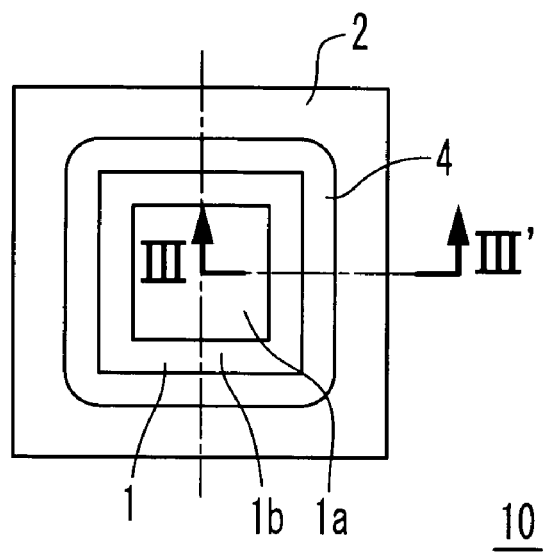
FIG. 3A is a plan view illustrating an exemplary plane structure of a semiconductor device in a first embodiment of the present invention.
Figure 3B:
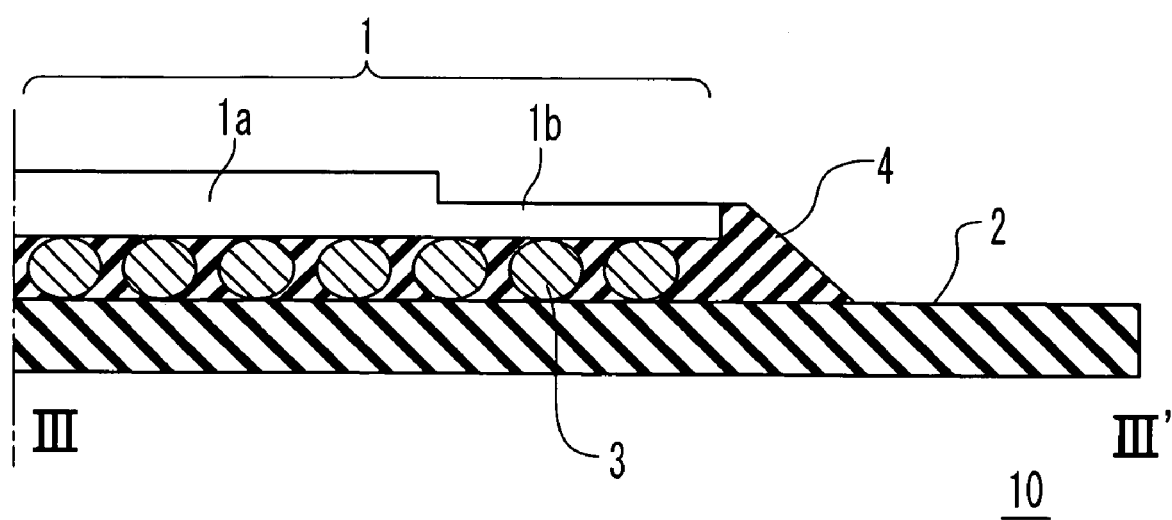
FIG. 3B is a section view illustrating an exemplary sectional structure of the semiconductor device in the first embodiment.

FIG. 3A is a plan view illustrating an exemplary plane structure of a semiconductor device 10 in a first embodiment of the present invention, and FIG. 3B is a section view of the semiconductor device 10 at a III-III' section shown in FIG. 3A.

The semiconductor device 10 adopts a flip-chip ball grid array structure or a bare chip structure. Specifically, the semiconductor device 10 is composed of an LSI chip 1, a circuit board 2, and a plurality of solder bumps 3. The LSI chip 1 is flip-chip connected with the circuit board 2 by the solder balls 3.

The solder bumps 3 are arranged in rows and columns on the main surface of the LSI chip 1. It should be noted that the front main surface means a surface at which elements are integrated. The solder bumps 3 are conductive, and therefore provide mechanical and electrical connections between the LSI chip 1 and the circuit board 2.

The space between the LSI chip 1 and the circuit board 2 is filled with resin 4 to completely cover the solder bumps 3. The resin 4 functions as the protective structure of the solder bumps 3.

The LSI chip 1 is composed of a center portion 1a and a peripheral portion 1b surrounding the center portion 1a. The center portion 1a has a relatively increased thickness. The peripheral portion 1b has a thickness smaller than that of the center portion 1a. Such structure provides a step near the edge of the LSI chip 1. In one embodiment, the thickness of the center portion 1a is about 700 μm, and the thickness of the peripheral portion 1b ranges from 300 to 400 μm.

The structure thus described increases the mechanical flexibility of the peripheral portion 1b and thereby allows the LSI chip 1 to expand or contract in accordance with the expansion or contraction of the circuit board 2. This effectively reduces thermal stress caused on the solder bumps 3 connected to the peripheral portion 1b of the LSI chip 1.

Preferably, the difference in the thickness between the center portion 1a and the peripheral portion 1b is in a range of 200 to 500 nm. The thickness difference in this range provides the LSI chip 1 with improved followability to expansion and contraction of the circuit board 2, and also effectively reduces the warpage of the LSI chip 1.

Figure 4:
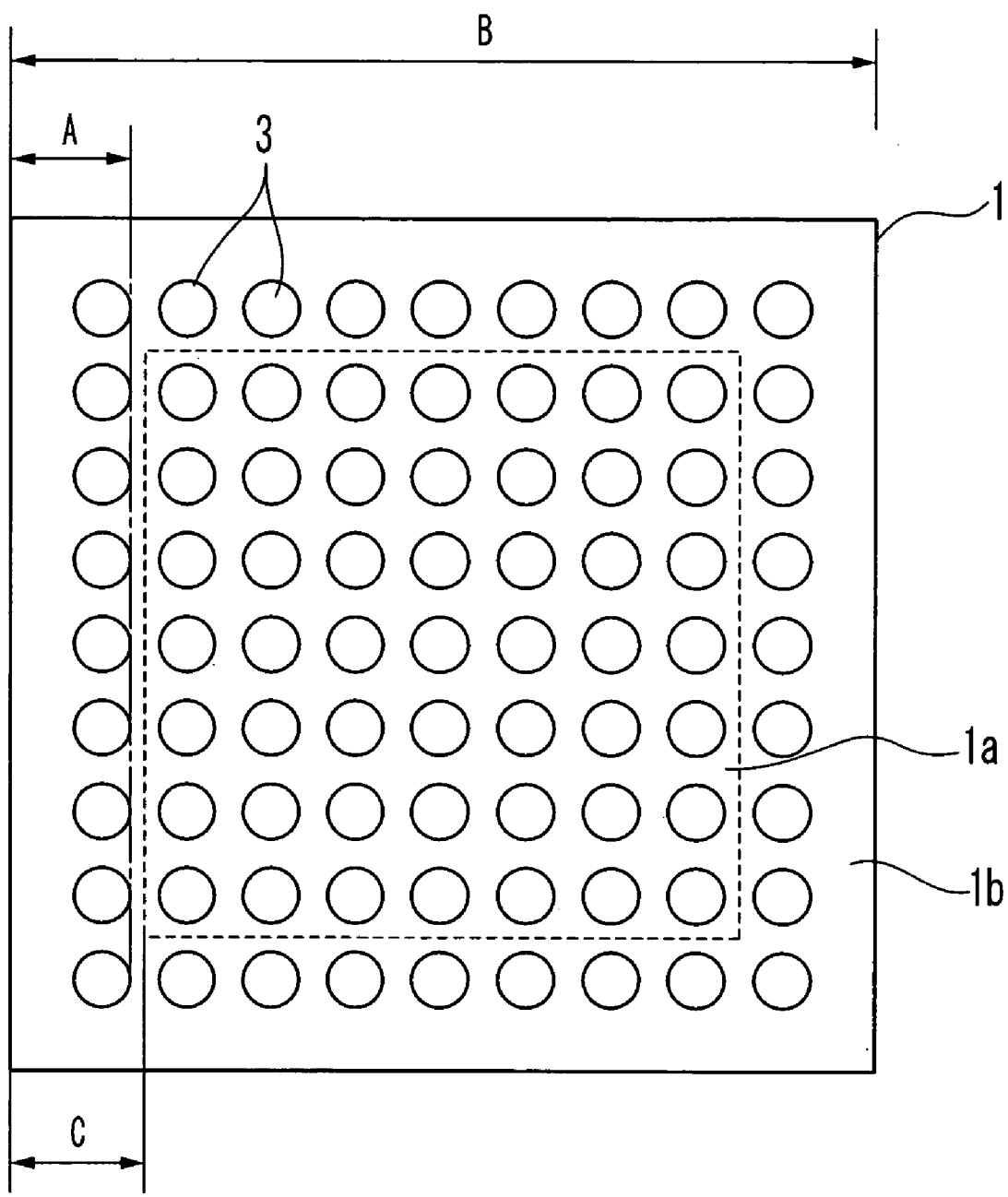
FIG. 4 is a plane view illustrating an exemplary arrangement of solder bumps in the semiconductor device in the first embodiment.

In a preferred embodiment, the peripheral portion 1b is connected to the outermost solder bumps 3; in other words, as shown in FIG. 4, the distance from the center portion 1a to the edge of the LSI chip 1, denoted by a symbol C, is equal to or larger than the distance A from the inner tangent plane of the outermost bumps 2 perpendicular to the circuit board 2. This effectively provides the LSI chip 1 with increased followability to expansion and contraction of the circuit board 2. In this embodiment, the distance C from the center portion 1a to the edge of the LSI chip 1 is about 600 μm, which is three times as large as the intervals of the solder bumps 3.

It is also preferable that the distance C from the center portion 1a to the vertical edge of the LSI chip 1 is equal to or smaller than one-fourth of the length A of the horizontal edge of the LSI chip 1. This effectively provides sufficient stiffness for the LSI chip 1. It should be noted that the terms "vertical" and "horizontal" in this description only indicate orthogonal directions.

FIGS. 5A to 5E are section views illustrating an exemplary manufacture process of the semiconductor device shown in FIGS. 3A and 3B.

Figure 5A:
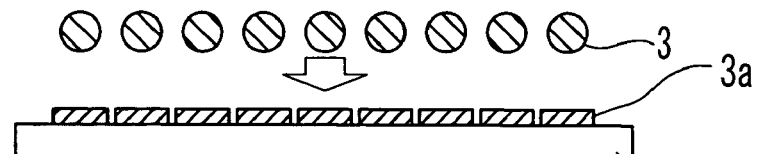
FIGS. 5A to 5E are section views illustrating an exemplary manufacture process of the semiconductor device in the first embodiment.

Referring to FIG. 5A, the manufacture process in this embodiment begins with developing flux 3a on electrodes pads (not shown) provided on the LSI chip 1 through a printing technique. This is followed by reflowing with the solder bumps 3 positioned in contact with the flux 3a.

Figure 5B:
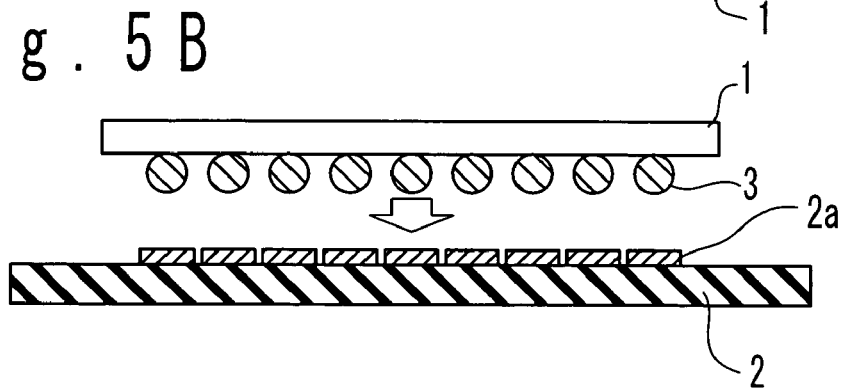

After the reflowing, as shown in FIG. 5B, flux and auxiliary solder 2a are prepared on electrode pads (not shown) disposed on the circuit board 2. This is followed by reflowing with the solder bumps 3 positioned in contact with the auxiliary solder 2a. This provides electrical and physical connections between the LSI chip 1 and the circuit board 2 through the solder bumps 3.

Figure 5C:
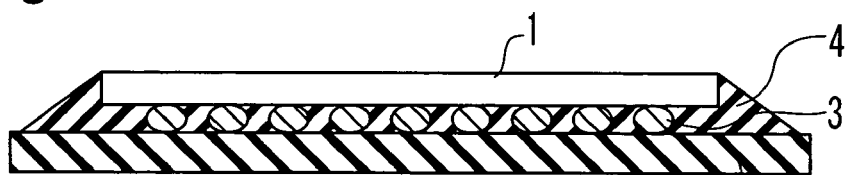
Figure 5D:
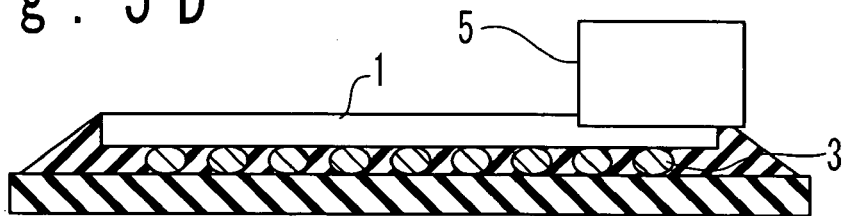
Figure 5E:
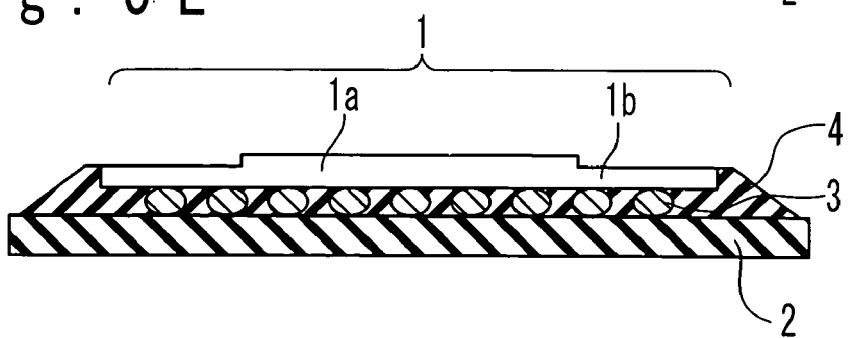

As shown in FIG. 5C, the space between the LSI chip 1 and the circuit board 2 is then filled with the resin 4 to completely cover the solder bumps 3.

After the resin filling process, the peripheral portion of the LSI chip 1 is selectively grinded on the rear surface. This completes the semiconductor device 10 in which the LSI chip 1 is composed of the central portion 1a having a relatively large thickness, and the peripheral portion 1b having a relatively small thickness.

The rear surface grinding may be achieved by using a laser machining apparatus or a mechanical grinder. When a laser machining apparatus is used, the rear surface of the LSI chip 1 is grinded by 300 to 400 μm through repeatedly irradiating laser beams with an appropriately controlled power. The size of the irradiated region of the laser beams is adjusted in accordance with the desired size of the region to be grinded. The same applies to the mechanical grinder.

One advantageous feature of the semiconductor device 10 in this embodiment is the reduced thermal stress caused on the LSI chip 1 and the reduced warpage of the LSI chip 1. The peripheral portion 1*b* of the LSI chip 1 has a reduced thickness smaller than that of the central portion 1*a*; in this embodiment, the thickness of the peripheral portion 1*b* is about 300 to 400 μm, and the thickness of the center portion 1*a* is about 700 μm. Therefore, the peripheral portion 1*b* exhibits increased flexibility. When temperature drop causes the contraction of the circuit board 2, causing strain of the solder bumps 3, for example, the peripheral portion 1*b* is contracted in accordance with the contraction of the circuit board 2 3. This effectively releases the thermal stress on the peripheral portion 1*b*.

It should be noted that the solder bumps 3 connected with the center portion 1*a* suffers from reduced thermal stress, because the strain of the solder bumps 3 resulting from the contraction of the circuit board 2 is small. Therefore, there is less necessity for the center portion 1*a* of the LSI chip 1 to be flexible. In this embodiment, the center portion 1*a* of the LSI chip 1 is designed to have a relatively increased thickness for thereby avoiding excessive warpage of the LSI chip 1.

Figure 1A:
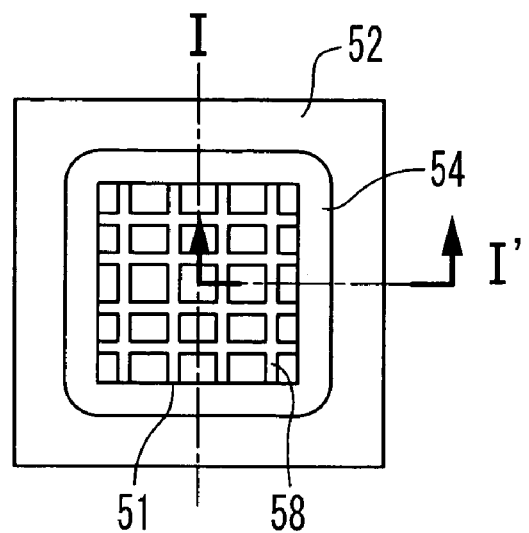
FIG. 1A is a plan view illustrating a plane structure of a conventional semiconductor device.
Figure 6:
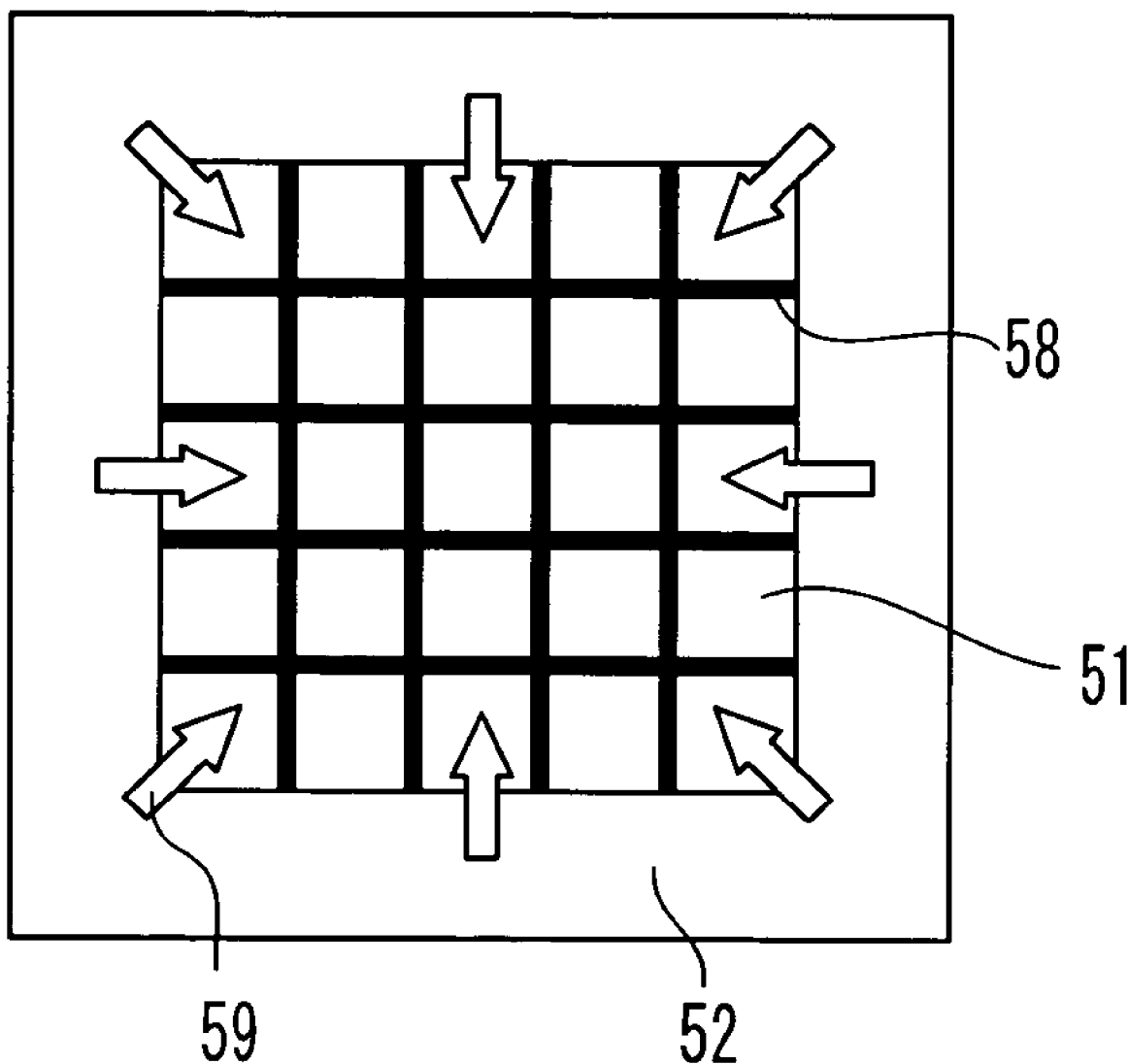
FIG. 6 is a section view illustrating directions of thermal stress.

The conventional semiconductor device shown in FIG. 1A occasionally exhibits a poor stress reduction effect on the solder bumps 53 near the corner of the LSI chip 51. This arises from the fact that the lattice-forming grooves are slanted at an angle of 45° with respect to the thermal stress along the diagonal directions of the LSI chip 1 as is understood by FIG. 6, in which arrows 59 indicates the directions of the thermal stress. In this embodiment, the LSI chip 1 is effectively expanded or contracted in accordance with the expansion or contraction of the circuit board 2 through decreasing the thickness of the peripheral portion 1*b*, where the stress reduction of the solder bumps 3 is requested. This effectively releases the stress on the solder bumps 3 with the stiffness of the LSI chip 1 maintained.

Second Embodiment

Figure 7A:
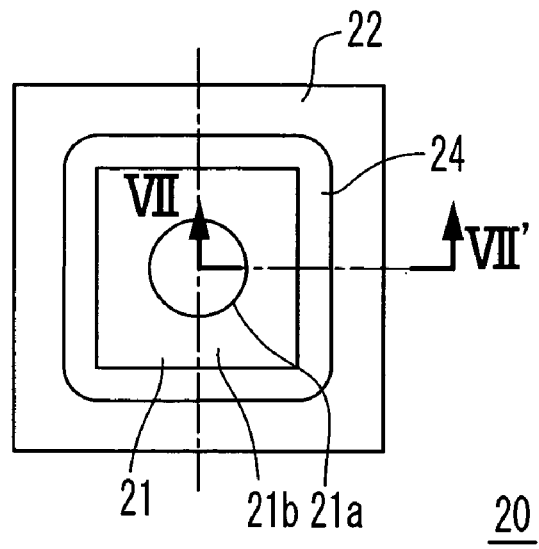
FIG. 7A is a plan view illustrating an exemplary plane structure of a semiconductor device in a second embodiment of the present invention.
Figure 7B:
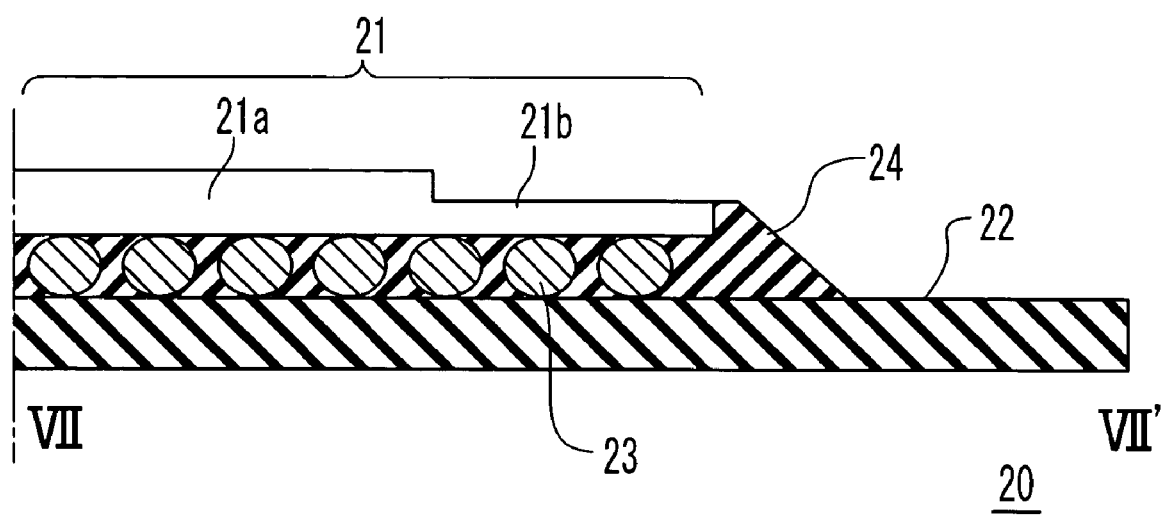
FIG. 7B is a section view illustrating an exemplary sectional structure of the semiconductor device in the second embodiment.

FIGS. 7A and 7B illustrate an exemplary structure of a semiconductor device 20 in a second embodiment of the present invention. The structure of the semiconductor device 20 is almost identical to that of the semiconductor device 10 shown in FIGS. 3A and 3B. As shown in FIG. 7B, the semiconductor device 20 is composed of an LSI chip 21, a circuit board 22, and a plurality of solder bumps 23, the space between the LSI chip 21 and the circuit board 22 being filled with resin 24 to completely cover the solder bumps 23. The LSI chip 21 is composed of a center portion 21*a* having a relatively increased thickness, and a peripheral portion 21*b* having a relatively decreased thickness.

The difference is that the plane structure of the center portion 21*a* is circular as shown in FIG. 7A. Such structure effectively enhances the stress reduction effect on the solder bumps 23 near the corner of the LSI chip 21. This results from the fact that the circular plane structure of the center portion 21*a* increases the distance between the center portion 21*a* and the corner of the LSI chip 21 compared to the rectangular structure, enhancing the effect of the thickness-reduced peripheral portion 21*b* at the corner of the LSI chip 21.

An exemplary manufacture process of the semiconductor device 20 in this embodiment is as follows.

In the same way as the first embodiment, the LSI chip 21 and the circuit board 22 are electrically and physical connected through the solder bumps 23 by using a conventional mounting technique. This is followed by filling the resin 24 to completely cover the solder bumps 23. The peripheral portion of the rear surface of the LSI chip 21 is then grinded by a laser machining apparatus or a mechanical grinder with the semiconductor device 20 placed on a rotating stage, to thereby forming the center portion 21*a* and the peripheral portion 21*b*. This completes the semiconductor device 20 shown in FIGS. 7A and 7B.

In an alternative embodiment, the plane structure of the center portion 21*b* may be polygonal, having five or more corners. Such structure also enhances the effect of the thickness-reduced peripheral portion 21*b* at the corner of the LSI chip 21, effectively releasing the thermal stress on the solder bumps 23 at the corners.

Third Embodiment

Figure 8A:
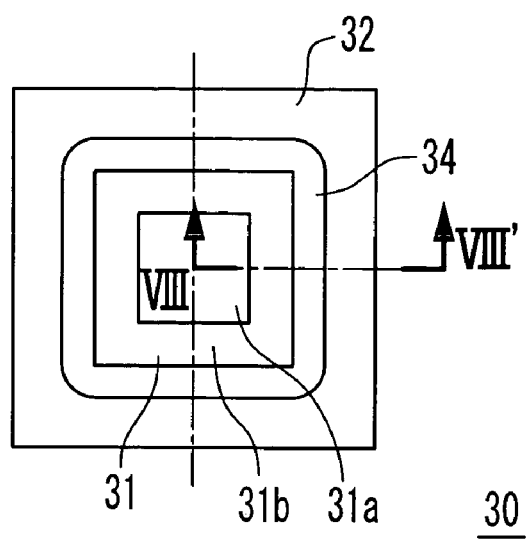
FIG. 8A is a plan view illustrating an exemplary plane structure of a semiconductor device in a third embodiment of the present invention.
Figure 8B:
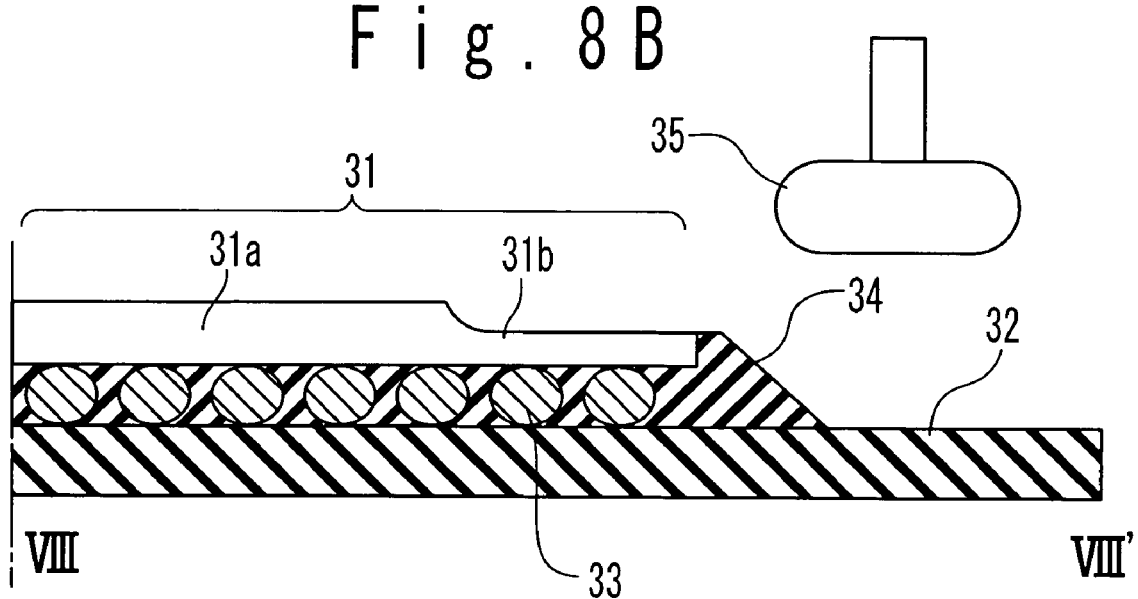
FIG. 8B is a section view illustrating an exemplary sectional structure of the semiconductor device in the third embodiment.

FIGS. 8A and 8B illustrate an exemplary structure of a semiconductor device 30 in a third embodiment of the present invention. The structure of the semiconductor device 30 is almost identical to that of the semiconductor device 10 shown in FIGS. 3A and 3B; the semiconductor device 30 is composed of an LSI chip 31, a circuit board 32, and a plurality of solder bumps 33, the space between the LSI chip 31 and the circuit board 32 being filled with resin 34 to completely cover the solder bumps 33. The LSI chip 31 is composed of a center portion 31*a* having a relatively increased thickness, and a peripheral portion 23*b* having a relatively decreased thickness.

The difference exists in the sectional structure of the peripheral portion 31*b* as shown in FIG. 8B. A slope is formed on the rear surface of the peripheral portion 31*b*. In other words, the thickness of the peripheral portion 31*b* is increased toward the central portion 31*a*. The rear surface of the peripheral portion 31*b* may be rounded. Such structure effectively decreases the gradient of the stress caused on the rear surface of the LSI chip 31, and thereby allows the LSI chip 31 to be expanded or contracted in accordance with the expansion or contraction of the circuit board 32, more effectively. This effectively releases the thermal stress on the peripheral portion 31*b*.

An exemplary manufacture process of the semiconductor device 30 in this embodiment is as follows.

In the same way as the first embodiment, the LSI chip 31 and the circuit board 32 are electrically and physical connected through the solder bumps 33 by using a conventional mounting technique. This is followed by filling the resin 34 to completely cover the solder bumps 33. The peripheral portion of the rear surface of the LSI chip 31 is then grinded to thereby forming the center portion 31*a* and the peripheral portion 31*b* so that the peripheral portion 31*b* is provided with a slope on the rear surface. The rear surface of the peripheral portion 31*b* is rounded through grinding the LSI chip 31 with a grinding wheel 35 having a rounded grinding surface. This completes the semiconductor device 30 shown in FIGS. 8A and 8B.

Simulation Result

Figure 9A:
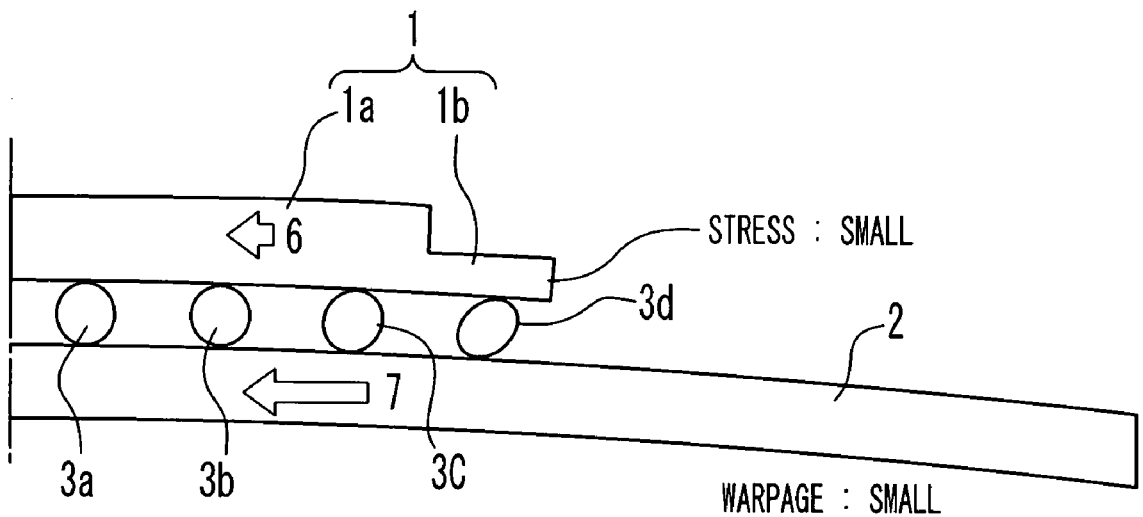
FIG. 9A is a section view illustrating the structure of a semiconductor device of Embodiment 1.
Figure 9B:
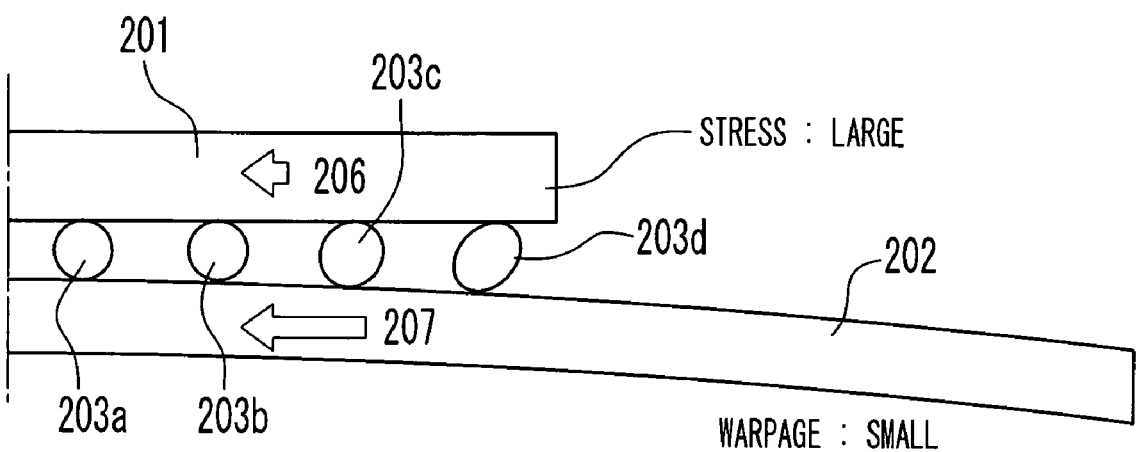
FIGS. 9B to 9D are section views illustrating the structures of semiconductor devices of Comparative Examples 1 to 3.
Figure 9C:
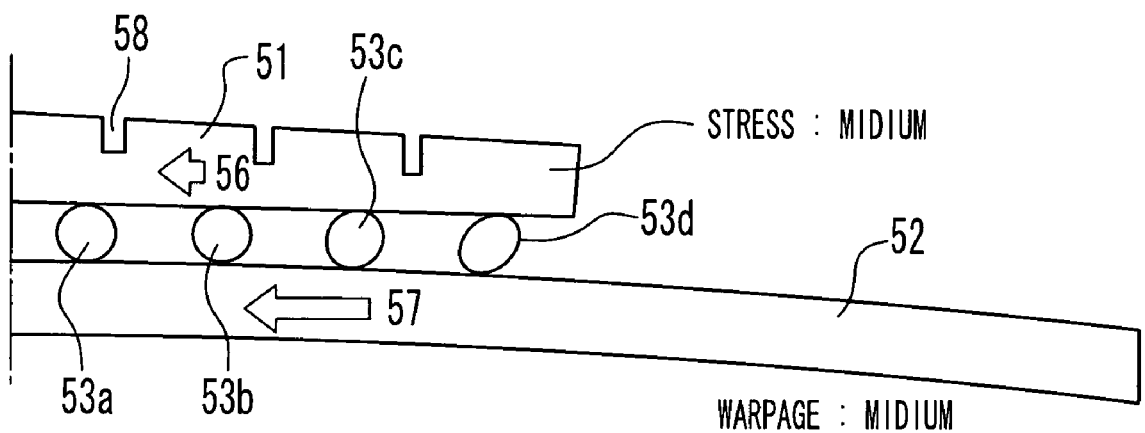
Figure 9D:
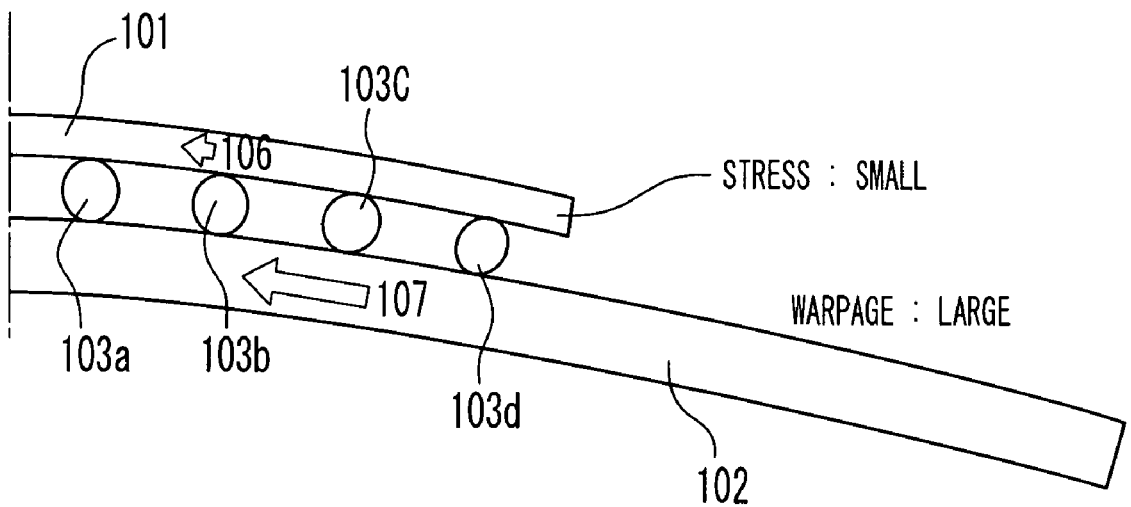

The effect of the present invention is evaluated through stress simulation. The stress simulation is directed to various semiconductor device structures shown in FIG. 9A to 9D. FIG. 9A illustrates an exemplary structure of a semiconductor device in one embodiment of the present invention, referred to as Embodiment 1, hereinafter. FIGS. 9B to 9D illustrate structures of conventional semiconductor devices, referred as Comparative Examples 1 to 3, respectively, hereinafter.

The semiconductor device of Embodiment 1, as shown in FIG. 9A, is equivalent to the semiconductor device in accordance with the present invention.

The semiconductor device of Comparative Example 1, as shown in FIG. 9B, is composed of an LSI chip 201, a circuit board 202, and a set of solder bumps 203a to 203d providing electrical and mechanical connections between the LSI chip 201 and the circuit board 202. The LSI chip 201 has a thickness of 700 μm.

Figure 1B:
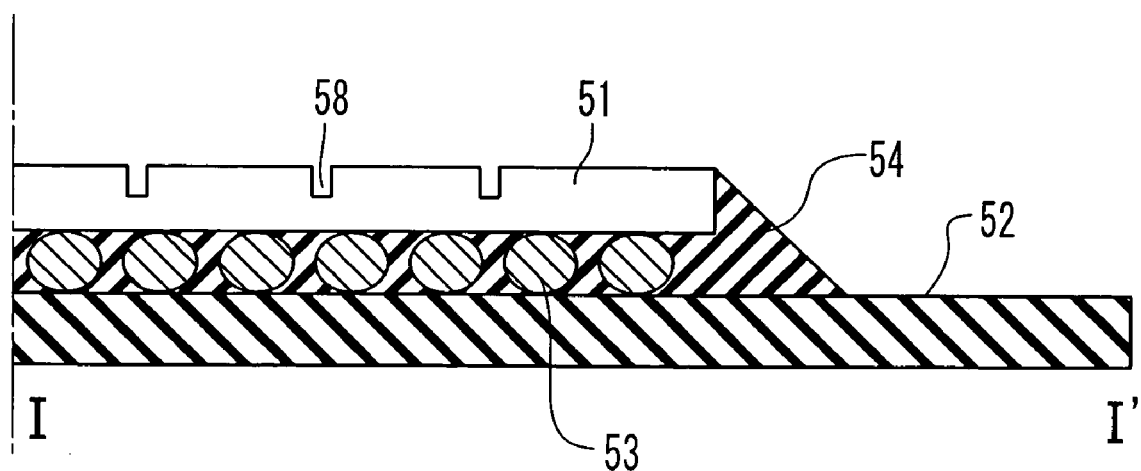
FIG. 1B is a section view illustrating a sectional structure of the conventional semiconductor device shown in FIG. 1A.

The semiconductor device of Comparative Example 2, as shown in FIG. 9C, is equivalent to the conventional semiconductor device shown in FIGS. 1A and 1B.

Figure 2A:
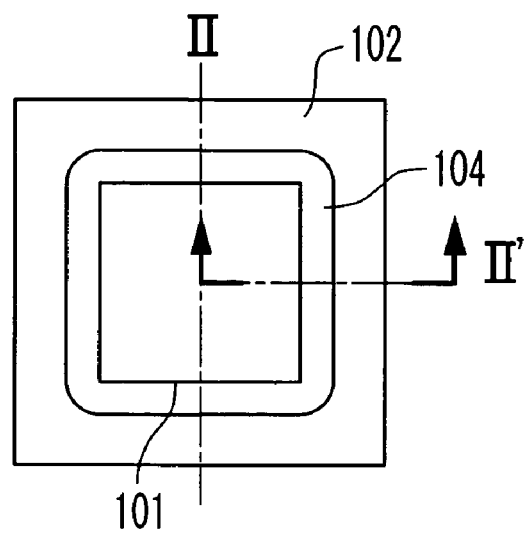
FIG. 2A is a plan view illustrating a plane structure of another conventional semiconductor device.
Figure 2B:
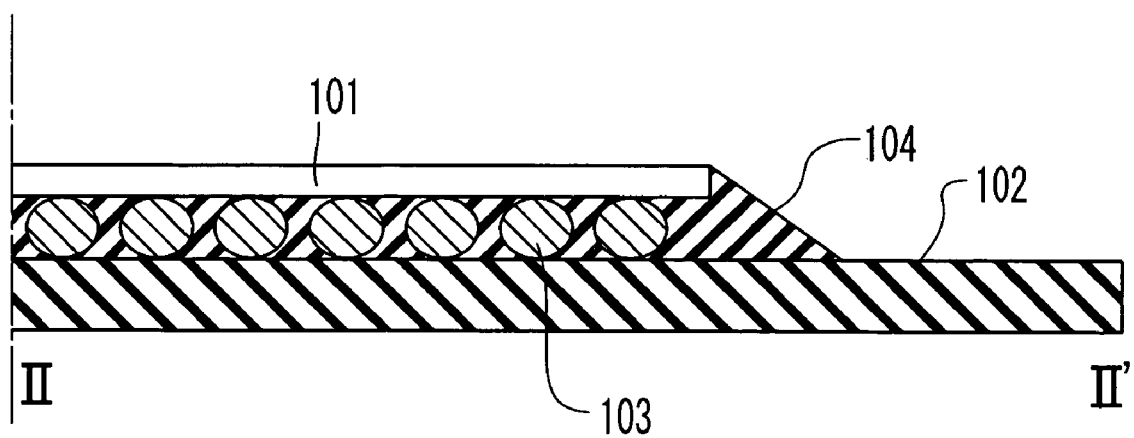
FIG. 2B is a plan view illustrating a sectional structure of the conventional semiconductor device shown in FIG. 2A.

The semiconductor device of Comparative Example 3, as shown in FIG. 9C, is equivalent to the conventional semiconductor device shown in FIGS. 2A and 2B.

Arrows 6, 56, 106, and 206 shown in FIGS. 9A to 9D indicate the contraction directions of the LSI chips 1, 51, 101, and 201, respectively, while arrows 7, 57, 107, and 207 in FIGS. 9A to 9D indicate the contraction directions of the circuit boards 2, 52, 102, and 202, respectively. The lengths of the arrows indicate the contraction degrees.

For simulation simplicity, stress simulations are implemented on the basis of the semiconductor device structure models shown in FIGS. 10A to 10D. In the structure models, the solder bumps are omitted, and the LSI chips 1, 201, 51, and 101 are assumed to be directly contacted on the circuit boards 2, 202, 52, and 102, respectively.

Figures 1, 10A:
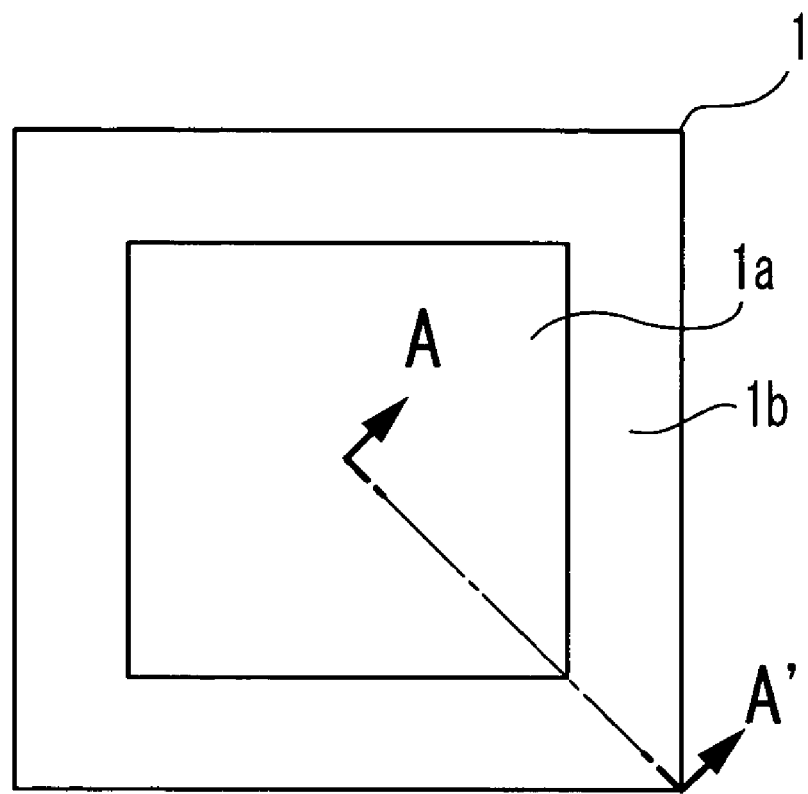
FIGS. 10A-1 and 10A-2 illustrate the semiconductor device structure model used for the stress simulation of Embodiment 1.
Figures 2, 10A:
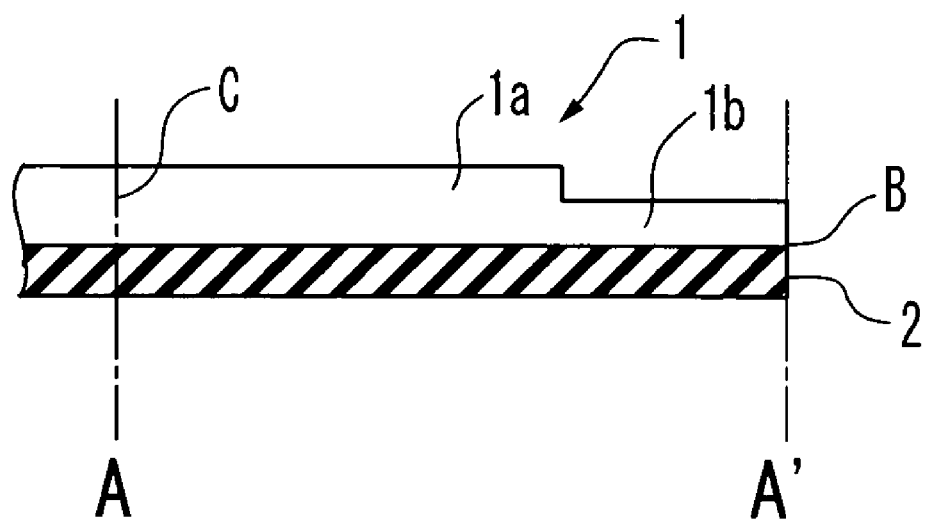
Figures 1, 10B:
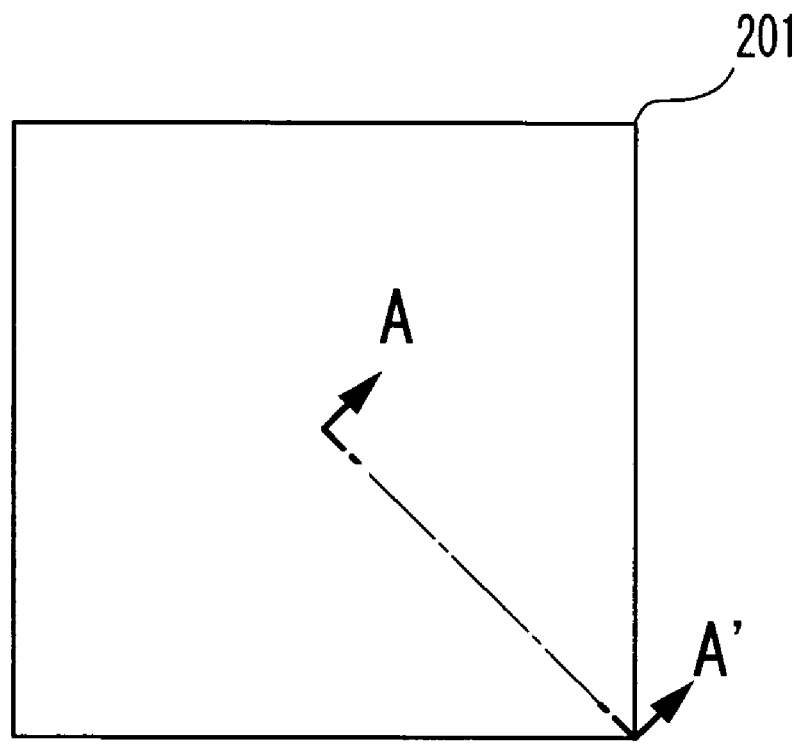
Figures 2, 10B:
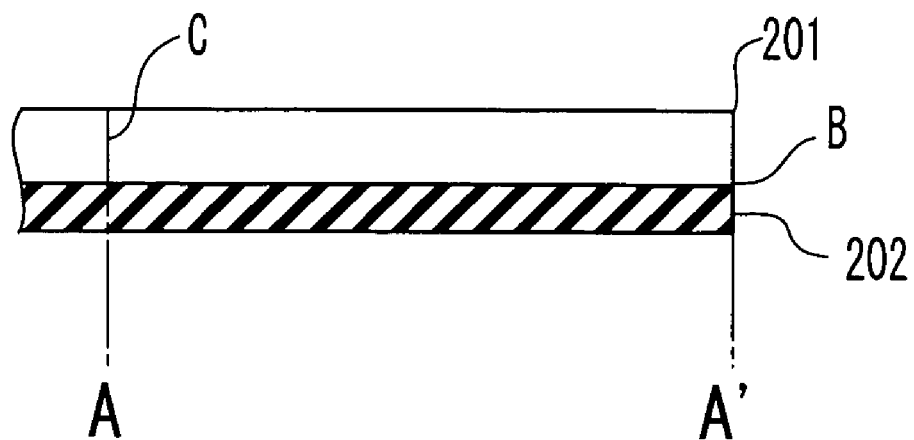
Figures 1, 10C:
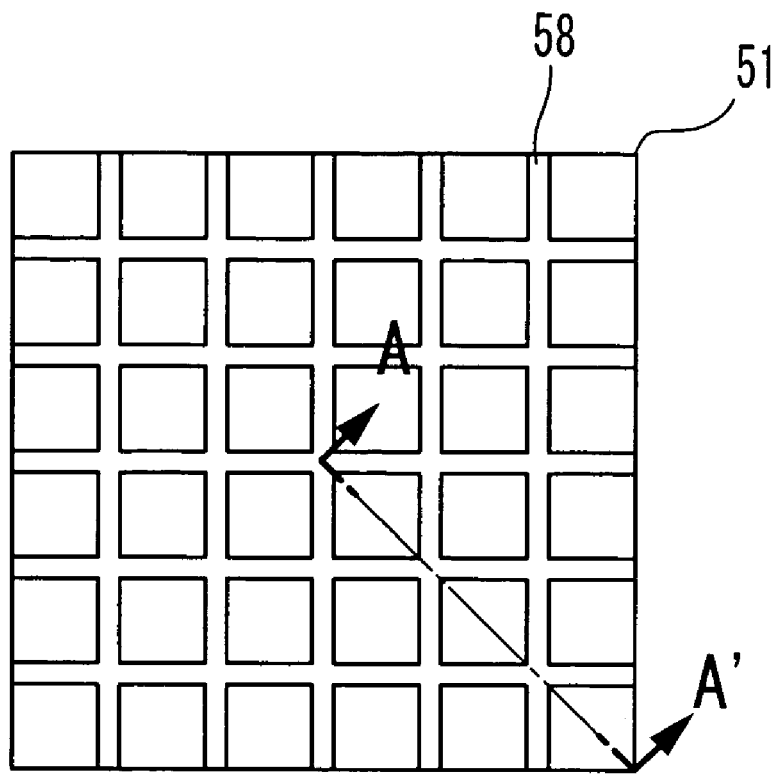
Figures 2, 10C:
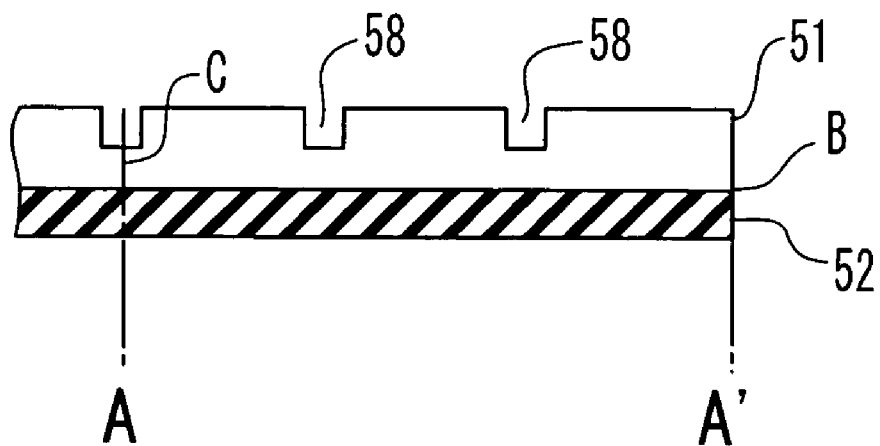

For the structure model shown in FIGS. 10A-1 and 10A-2, the center portion 1a of the LSI chip 1 is assumed to have a thickness of 700 μm, and the peripheral portion 1b is assumed to have a thickness of 400 μm. For the structure model shown in FIGS. 10C-1 and 10C-2, the width of the grooves 58 is assumed to be 200 μm, and the intervals thereof are assumed to be 1000 μm.

Figures 1, 10D:
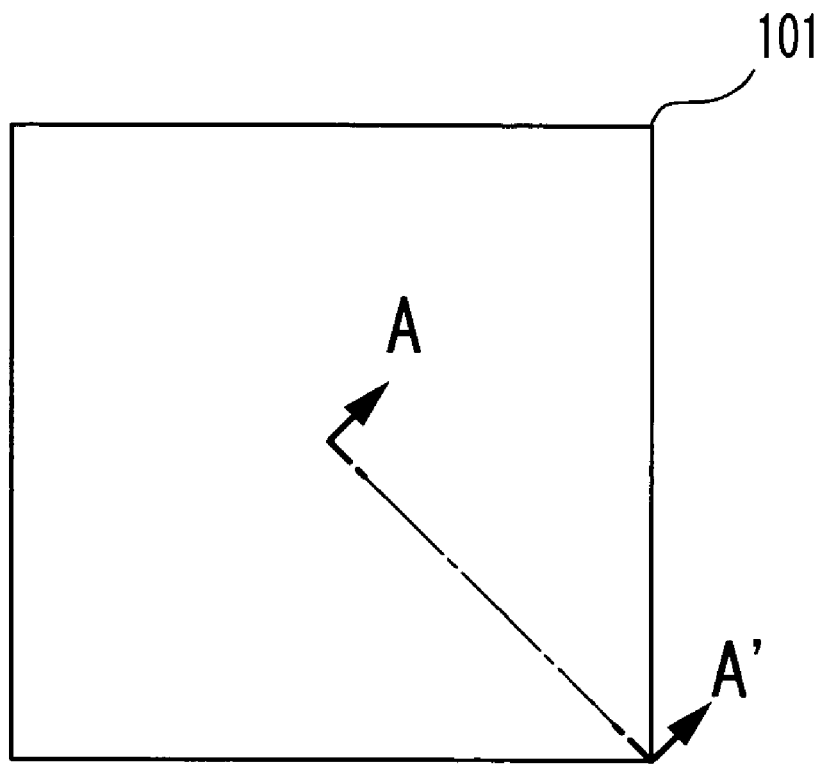
Figures 2, 10D:
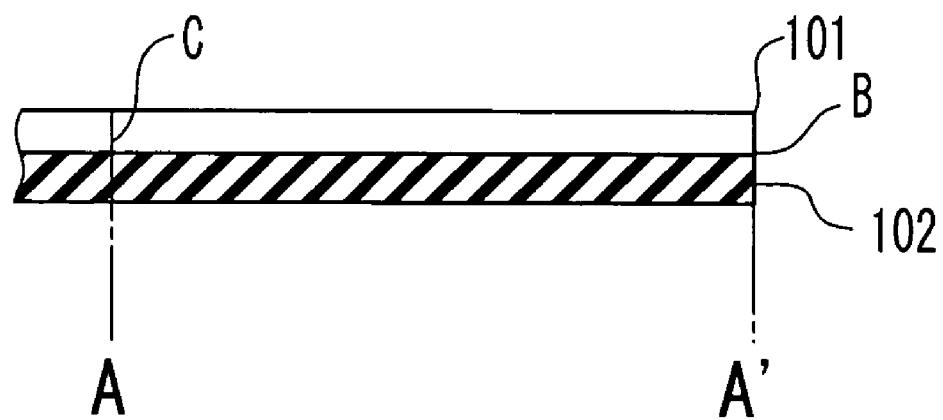

FIG. 11 is a table describing calculated thermal stresses at points B and C shown in FIGS. 10A-2 to 10D-2, and calculated warpages at points A' shown in FIGS. 10A-2 to 10D-2, obtained by the stress simulations. In the table shown in FIG. 11, the warpages are defined as being positive when the points A' are shifted upward.

The simulation result indicates that the semiconductor device structure of Embodiment 1 shown in FIG. 9A, associated with the semiconductor device in accordance with the present invention, exhibits a reduced thermal stress on the outmost solder bumps 3d, avoiding excessive warpage of the LSI chip 1.

The semiconductor device structure of Comparative Example 1 shown in FIG. 9B, associated with the conventional semiconductor device with an increased LSI chip thickness, undesirably exhibits an increased thermal stress on the outmost solder bumps 203d due to the poor flexibility of the LSI chip 201 to the contraction of the circuit board 202.

The semiconductor device structure of Comparative Example 2 shown in FIG. 9C, associated with the conventional semiconductor device shown in FIGS. 1A and 1B, provides the LSI chip 51 with a certain level of flexibility to the contraction of the circuit board 52. This releases the thermal stress on the outmost solder bumps 53d to some degree; however, the simulation result has proved that the stress reduction effect of the Comparative Example 2 is not sufficient. Additionally, the simulation result indicates that the Comparative Example 2 suffers from rather increased warpage of the LSI chip 51.

The semiconductor device structure of Comparative Example 3 shown in FIG. 9D, associated with the conventional semiconductor device shown in FIGS. 2A and 2B, exhibits a superior stress reduction effect on the outmost solder bumps 103d; however, the Comparative Example 3 undesirably suffers from increased warpage of the LSI chip 101.

As thus described, the simulation results has proved that reducing the thickness of the peripheral portion of the LSI chip effectively reduces the thermal stress caused on the outmost solder bumps, avoiding excessive warpage of the LSI chip.

It is apparent that the present invention is not limited to the above-described embodiments, which may be modified and changed without departing from the scope of the invention.

What is claimed is:

1. A semiconductor device comprising:
   a circuit board;
   a semiconductor chip; and
   a plurality of bumps connecting said semiconductor chip with said circuit board,
   wherein said semiconductor chip includes a center portion and a peripheral portion surrounding said center portion, a thickness of said peripheral portion being smaller than that of said center portion, and
   wherein a distance from the center portion to an edge of the semiconductor chip is larger than a distance from an inner tangent plane of outermost ones of the plurality of bumps perpendicular to the circuit board.

2. The semiconductor device according to claim 1, wherein said plurality of bumps are arrayed in rows and columns, and
   wherein outmost ones of said plurality of bumps are connected with said peripheral portion.

3. The semiconductor device according to claim 1, wherein said plurality of bumps are arrayed in rows and columns,
   wherein said semiconductor chip has first and second edges orthogonal to each other,
   wherein said center portion is rectangular,
   wherein said distance from said center portion to said first edge of said semiconductor is equal to or smaller than one-fourth of a length of said second edge of said semiconductor chip.

4. The semiconductor device according to claim 1, wherein a difference in thickness between said central and peripheral portions is in a range of 200 to 500 μm.

5. The semiconductor device according to claim 1, wherein said thickness of said peripheral portion is increased toward said center portion.

6. The semiconductor device according to claim 1, wherein a space between said circuit board and said semiconductor chip is filled with resin to cover said plurality of bumps.

7. A manufacture method of a semiconductor device, comprising:
   preparing a circuit board and a semiconductor chip;
   providing a plurality of bumps on said semiconductor chip;
   connecting said semiconductor chip with said circuit board by said plurality of bumps; and
   selectively grinding a peripheral portion of a rear surface of said semiconductor chip to form a step structure with a center portion of the semiconductor chip,
   wherein a distance from a center portion to an edge of the semiconductor chip is larger than a distance from an inner tan2ent plane of outermost ones of said plurality of bumps perpendicular to the circuit board.

8. The device of claim 1, wherein the transition between the center portion and the peripheral portion forms a step.

9. The device of claim 1, wherein the center portion is circular.

10. The device of claim 1, wherein the transition between the center portion and the peripheral portion forms a slope.

11. The method of claim 7, wherein the transition between the center portion and the peripheral portion forms a step.

12. The method of claim 7, wherein the center portion is circular.

13. The method of claim 7, wherein the transition between the center portion and the peripheral portion forms a slope.

14. A semiconductor device comprising:
a circuit board;
a plurality of connectors coupled to the circuit board; and
a semiconductor chip having a first surface and a second surface opposing the first surface, the first surface being coupled to the plurality of connectors, the second surface having a center surface and a peripheral surface, the peripheral surface of the second surface being lower than the center surface of the second surface, and a boundary between the center surface and the peripheral surface having a step shape.

15. The semiconductor device according to claim 14, further comprising:
a space among the circuit board, the connectors and the first surface being filled with a resin.

16. The semiconductor device according to claim 14, wherein a shape of the center surface is circular.

17. The semiconductor device according to claim 14, wherein the connectors are formed from a plurality of bumps electrically connecting the circuit board and the semiconductor chip.

18. A semiconductor device comprising:
a circuit board;
a plurality of connectors coupled to the circuit board; and
a semiconductor chip having a first surface and a second surface opposing the first surface, the first surface being coupled to the plurality of connectors, the second surface having a center surface and a peripheral surface, and a boundary between the center surface and the peripheral surface having a concave shaped slope.

19. The semiconductor device according to claim 18, wherein the connectors are formed from a plurality of bumps electrically connecting the circuit board and the semiconductor chip.

20. The semiconductor device according to claim 18, wherein the peripheral surface of the second surface is lower than the center surface of the second surface.

* * * * *